United States Patent [19]
Verhelst et al.

[11] Patent Number: 5,057,774
[45] Date of Patent: Oct. 15, 1991

[54] APPARATUS FOR MEASURING THE QUIESCENT CURRENT OF AN INTEGRATED MONOLITHIC DIGITAL CIRCUIT

[75] Inventors: Sebastiaan C. Verhelst; Evert Seevinck; Keith Baker, all of Eindhoven, Netherlands

[73] Assignee: U.S. Philips Corporation, New York, N.Y.

[21] Appl. No.: 462,663

[22] Filed: Jan. 9, 1990

[30] Foreign Application Priority Data

Jan. 10, 1989 [NL] Netherlands ................... 8900050

[51] Int. Cl.$^5$ ............................................. G01R 31/28
[52] U.S. Cl. ............................... 324/158 R; 371/22.5
[58] Field of Search ................... 324/158 R, 73.1; 371/21.3, 21.4, 22.5, 25.1, 27; 365/201

[56] References Cited
U.S. PATENT DOCUMENTS 4,631,724 12/1986 Shimizu .............................. 371/27
4,637,020 1/1987 Schinabeck ....................... 371/22.1
4,710,704 1/1987 Ando ................................ 371/25.1

OTHER PUBLICATIONS

Maly et al; "Built-in-Current . . . "; Proceeding ICCAD 1988; IEEE; 1988; pp. 340-343.

*Primary Examiner*—Ernest F. Karlsen
*Attorney, Agent, or Firm*—Bernard Franzblau

[57] ABSTRACT

An arrangement for measuring the quiescent current of a digital IC includes a current sensor connected in series with the IC and the voltage supply, a voltage stabilization circuit for stabilizing the voltage across the IC and a signal processing circuit coupled thereto for processing the measured quiescent current. The quiescent current is measured when no flip-flops are switched in the IC. By means of the arrangement, it is possible to measure rapidly and accurately whether the quiescent current assumes an abnormal value, which indicates that the IC contains defects. The signal processing circuit may include a current mirror which is coupled to a current comparator circuit supplying a digital output signal for determining the existence of a defect.

21 Claims, 4 Drawing Sheets

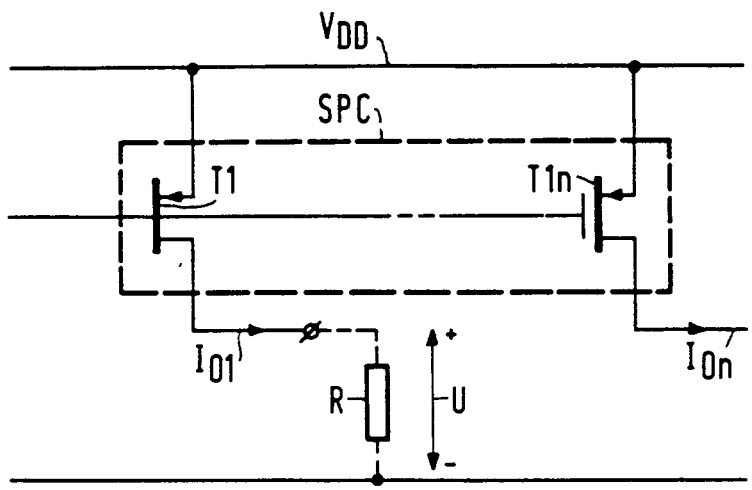
FIG.3
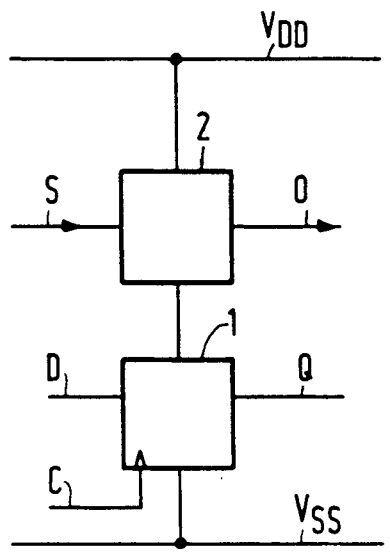
FIG.4A
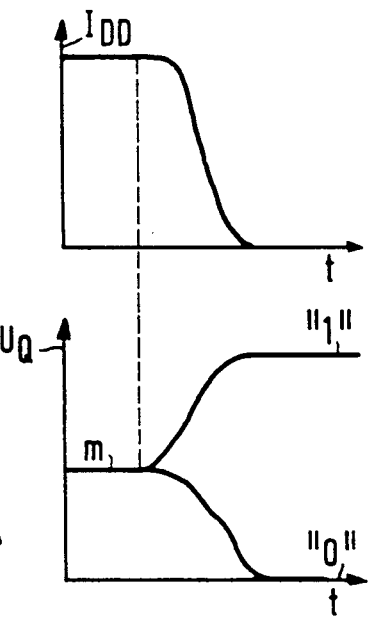
FIG.4B
FIG.4C
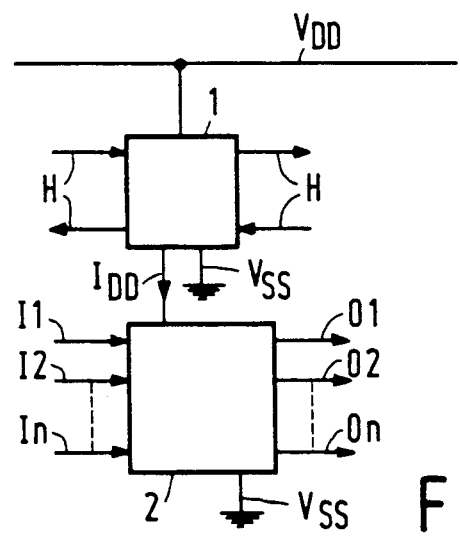
FIG.5
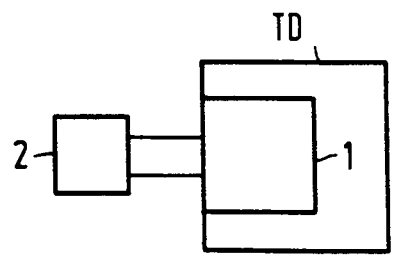
FIG.6

APPARATUS FOR MEASURING THE QUIESCENT CURRENT OF AN INTEGRATED MONOLITHIC DIGITAL CIRCUIT

BACKGROUND OF THE INVENTION

This invention relates to an arrangement for measuring or determining the quiescent current of an integrated monolithic digital circuit, which arrangement comprises a current sensor for measuring (sensing) the quiescent current, which is provided with a first connection terminal for coupling to a supply terminal of the integrated monolithic circuit and with a second connection terminal for coupling to a supply.

The invention further relates to an integrated monolithic digital circuit provided with such a current measuring arrangement.

The invention moreover relates to a testing apparatus provided with such an arrangement.

An arrangement for measuring a quiescent current of an integrated monolithic digital circuit is known from the article "Built-In-Current Testing-Feasibility Study", W. Maly and P. Nigh, Proceeding ICCAD 1988, pp. 340-343, IEEE. In this publication, testing of digital VLSI circuits by means of a current sensor incorporated in the integrated monolithic circuit is described. The current sensor has a non-linear characteristic, more particularly the current sensor is a bipolar transistor having an exponential I-U characteristic, is. The current sensor is included between the monolithic circuit and the supply of the monolithic circuit and serves to measure abnormal quiescent currents which are due, for example, to shortcircuits and/or floating gate electrodes of, for example, MOS-FET's in the VLSI circuit. The measurements are made dynamically, that is to say that test vectors are supplied at inputs of the VLSI circuit and the quiescent current is measured in rest periods between switching operations. If the VLSI circuit operates satisfactorily, the quiescent current can be orders of magnitude smaller as compared with an unsatisfactory operation. A quiescent current measurement can therefore give an indication about a satisfactory or an unsatisfactory operation of the VLSI circuit. The voltage across the current sensor is compared with a reference voltage in quiescent current periods. If the voltage is larger than a predetermined value, the VLSI circuit is very likely to be defective. Because of the exponential characteristic of the transistor, it is possible to discriminate between a comparatively large current during switching of transistors in the VLSI circuit and the comparatively small quiescent currents. In the prior arrangement, a bipolar current sensor is used in a MOS environment, which may give rise to problems with respect to integration in the same integrated monolithic digital circuit. Further, a satisfactorily operating VLSI circuit, in which a current sensor is included, will operate more slowly than a VLSI circuit without a current sensor.

SUMMARY OF THE INVENTION

The invention has, inter alia, for its object to provide an arrangement of the kind mentioned in the opening paragraph by means of which a rapid quiescent current measurement can be carried out and with a high resolution.

An arrangement for measuring a quiescent current of an integrated monolithic digital circuit according to the invention is characterized in that the arrangement comprises voltage stabilization means for stabilizing a voltage at the first connection terminal and signal processing means coupled to the voltage stabilization means for signal processing of the quiescent current Due to the fact that also with large current variations the voltage across the current sensor remains substantially constant, on the one hand a high resolution will be attained when measuring the quiescent current and on the other hand the operation of the integrated monolithic circuit will not be adversely affected with peak currents during switching.

An embodiment of an arrangement according to the invention is characterized in that the voltage stabilization means comprise a differential amplifier, of which a first input is coupled to the first connection terminal, a second input is coupled to the second connection terminal or to a connection terminal for connection to a reference voltage source, and an output is coupled to a gate electrode of the transistor. In the case in which the second input is coupled to the second connection terminal, with a predetermined offset voltage (for example 100 mV) of the differential amplifier, the voltage drop across the transistor will then be low and because of the feedback loop the voltage drop will vary only comparatively slightly, even with comparatively large current variations. In the case in which the second input is coupled to a connection terminal for connection to a reference voltage source, for integrated monolithic circuits to which a higher external supply voltage is supplied than an internal supply voltage as operating voltage ("voltage down conversion"), functions of the current measurement, voltage stabilization and step down of the external supply voltage will be combined. If the predetermined offset voltage is substantially 0 V, the voltage at the first connection terminal, and hence the operating voltage of the integrated monolithic circuit, will be substantially equal to the voltage of the reference voltage source.

An embodiment of an arrangement according to the invention is characterized in that the output of the differential amplifier is coupled to the gate electrode via a modification circuit for modifying the operation of the current sensor outside of a quiescent current measurement period or outside a quiescent current measurement of the integrated monolithic circuit. As a result, if the current measuring arrangement is integrated in the integrated monolithic circuit, in normal conditions the operation will be substantially the same as the operation without a current sensor integrated monolithic circuit.

An embodiment of an arrangement according to the invention is characterized in that the signal processing means comprise a first transistor, which constitutes with the current sensor a current mirror configuration, which is designed to supply via an output electrode of the first transistor a current which is a mirror image of the quiescent current. As a result, a measured quiescent current is obtained on which further operations can be carried out without the operation of the integrated monolithic circuit being substantially adversely affected, which could be the case, for example, if an ohmic load were to be coupled to the first connection terminal for obtaining a measuring voltage derived from the quiescent current.

A further embodiment of an arrangement according to the invention is characterized in that the signal processing means comprise a differential amplifier, which is coupled via a first input to the first connection terminal, via a second input to the output electrode of the first transistor and via an output to a gate electrode of a second transistor, which second transistor is coupled via a first output electrode to the output electrode of the first transistor, while a second output electrode of the second transistor serves to supply a further processed quiescent current. The differential amplifier of the voltage stabilization means is adjusted so that the voltage drop across the current sensor is very low. The supply voltage of the integrated monolithic circuit is then very stable and substantially equal to the external supply voltage. The differential amplifier of the signal processing means and the second transistor ensure that the first transistor, like the current sensor transistor, operates in the linear range (triode range). As a result, a current equal (with equal geometric dimensions of the current sensor transistor and the first transistor) or a current proportional (with different geometric dimensions) to that flowing through the current sensor transistor will flow through the first transistor. The second transistor supplies a measured current for further processing.

An embodiment of an arrangement according to the invention is characterized in that the signal processing means further comprise transistors, which constitute with the current sensor a current mirror configuration, while for obtaining different processed quiescent currents the transistors of the signal processing means have different geometric dimensions. As a result, different currents proportional to the quiescent current are obtained for further processing.

An integrated monolithic digital circuit according to the invention, which comprises at least one subcircuit, is characterized in that the integrated monolithic circuit comprises at least one measuring arrangement, or at least a part thereof, for measuring the quiescent current of subcircuits, of combinations of subcircuits, or of all subcircuits. If the integrated monolithic circuit comprises the current sensor, the voltage stabilization means and the signal processing means, the measured quiescent current can be passed to a connection pin of the integrated monolithic circuit for further processing at the printed circuit board level or by means of a testing apparatus for integrated monolithic digital circuits. If the comparison means are also integrated on the integrated monolithic circuit (everything "on-chip"), before a next switching peak the digitized value of the processed quiescent current may be introduced, for example, into a flip-flop. For an integrated monolithic circuit comprising several subcircuits, the digitized values of the quiescent currents obtained can be further processed in "on-chip" or "off-chip" testing apparatuses, which use, for example, techniques such as "scantest", "self-test" and "boundary scan". With respect to the lastmentioned techniques, reference may be made to the relevant literature.

BRIEF DESCRIPTION OF THE PREFERRED EMBODIMENTS

The invention now will be described more fully with reference to the accompanying drawing, in which:

FIG. 1A is a diagrammatic representation of an arrangement according to the invention, FIG. 1B a current through an integrated monolithic digital circuit as a function of time when supplying a given test vector at inputs thereof, FIG. 2 shows an embodiment of signal processing means and comparison means in an arrangement according to the invention, FIG. 3 shows an embodiment which provides multiplication of a measured current, FIG. 4A shows a current measurement according to the invention to measure a metastable condition in a digital circuit, FIG. 4B shows a current of such a circuit, FIG. 4C shows a voltage at an output terminal of such a digital circuit, FIG. 5 shows a current measurement according to the invention to obtain information about the stability of outputs of combinatorial digital subcircuits, FIG. 6 shows a testing apparatus provided with an arrangement according to the invention, FIG. 7A shows an embodiment of the current measuring circuit with an embodiment of the modification circuit, FIG. 7B shows another embodiment of the modification circuit, FIGS. 8A and 8B show configurations of IC's including a current measuring arrangement according to the invention, FIG. 9 shows the coupling of the current measuring arrangement with a scan chain in an IC, and FIG. 10 shows the coupling of the current measuring circuit according to the invention with a self-test circuit in an IC.

DESCRIPTION OF THE PREFERRED EMBODIMENTS

Figure 1A:
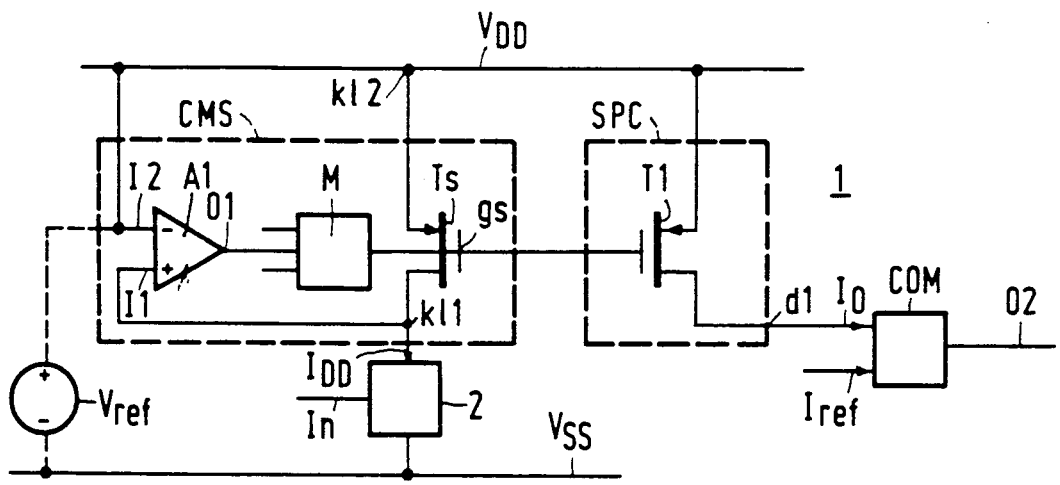

FIG. 1A shows diagrammatically an arrangement 1 according to the invention which is coupled to an integrated monolithic digital circuit 2, of which a quiescent current $I_{DD}$ is measured. The arrangement 1 comprises a transistor Ts as the current sensor for measuring or sensing the quiescent current. The transistor Ts is connected in series with the integrated monolithic circuit 2 between a first supply line $V_{DD}$ and a second supply line $V_{SS}$. According to the invention, the voltage at a first connection terminal kl1 is stabilized, i.e. kept constant with the aid of voltage stabilization (regulator) means, in the example shown with the aid of a fed-back differential amplifier A1. The current sensor Ts is connected via a second connection terminal kl2 to the supply line $V_{DD}$. The current sensor Ts and the differential amplifier A1 constitute a current measuring circuit CMS according to the invention. The differential amplifier A1 is connected via a first input I1(+) to the first connection terminal kl1, via a second input I2(−) to the supply line $V_{DD}$ (via a reference source $V_{ref}$ to the supply line $V_{SS}$) and through an output O1 directly or via a modification circuit M to a gate electrode gs of the current sensor Ts. The modification circuit M may be an amplifier or a filter and may have additional inputs to render the transistor Ts completely conducting outside the measurement of the quiescent current. If the input I2 is connected to the supply line $V_{DD}$, with an offset of the differential amplifier A1 of, for example, 100 mV, the voltage drop across the sensor Ts will be about 100 mV. By means of the fed-back differential amplifier A1, the voltage at the terminal kl1 is stabilized. If the input I2 is connected via the reference voltage source $V_{ref}$ to the supply line $V_{SS}$, with an offset of substantially 0 V, the voltage at the terminal kl1 will be stabilized on substantially $V_{ref}$. The current measuring circuit CMS may be integrated with the integrated monolithic circuit, may be provided on a printed circuit board with the integrated monolithic circuit, may be incorporated in a testing apparatus for integrated monolithic circuits or may be present in an interface module as part of such a testing apparatus. In connection with the speed and with other testing methods "on-chip", such as, for example, "scan test", it is advantageous to integrate the current measuring circuit with the integrated monolithic circuit. The arrangement 1 further comprises signal processing means SPC for processing the quiescent current $I_{DD}$. The signal processing means SPC comprise the first transistor T1, which constitutes with the transistor Ts a current mirror configuration. Via an output electrode d1, a current is supplied, which is a mirror image of the quiescent current $I_{DD}$. Further, the arrangement 1 comprises comparison means COM for comparing the processed quiescent current $I_O$ with a reference current $I_{ref}$. At an output O2 of the comparison means COM, an indication appears as to whether or not the reference current is exceeded by the current $I_O$. The indication may be digital; a logic "1" may then indicate, for example, that the current $I_o$ exceeds the reference current.

FIG. IB shows the current $I_{DD}$ through an integrated monolithic digital circuit 2 as a function of the time t when supplying a given test vector at the inputs In thereof. t1, t2, t3 and t4 denote a few time instants. At the instants t1 and t3, switching takes place in the integrated monolithic circuit 2. Between t1 and t2 and between t3 and t4, switching results in current peaks p1 and p2. Between t2 and t3 and after t4, the integrated monolithic digital circuit 2 is in the rest condition. In a CMOS circuit, for example, a current peak has a value of the order of 10 mA and a quiescent current in the situation in which the CMOS circuit is not defective of the order of pA/nA. If there is a defect, such as, for example, a shortcircuit, the quiescent current may increase, for example, to an order of nA/mA. The measured current in the rest condition is $I_O$. If $I_O > I_{ref}$, this may indicate a defect in the CMOS circuit. The threshold value $I_{ref}$ is adjustable.

It should be noted the current measuring circuit can be simplified further by omitting the differential amplifier A1 and by then connecting the gate electrode gs to the terminal kl1, but due to low loop amplification a satisfactory stabilization of the voltage at the terminal kl1 is then not attained. It should further be noted that with different geometric dimensions of the transistors Ts and Tl, current amplification can be obtained.

Figure 2:
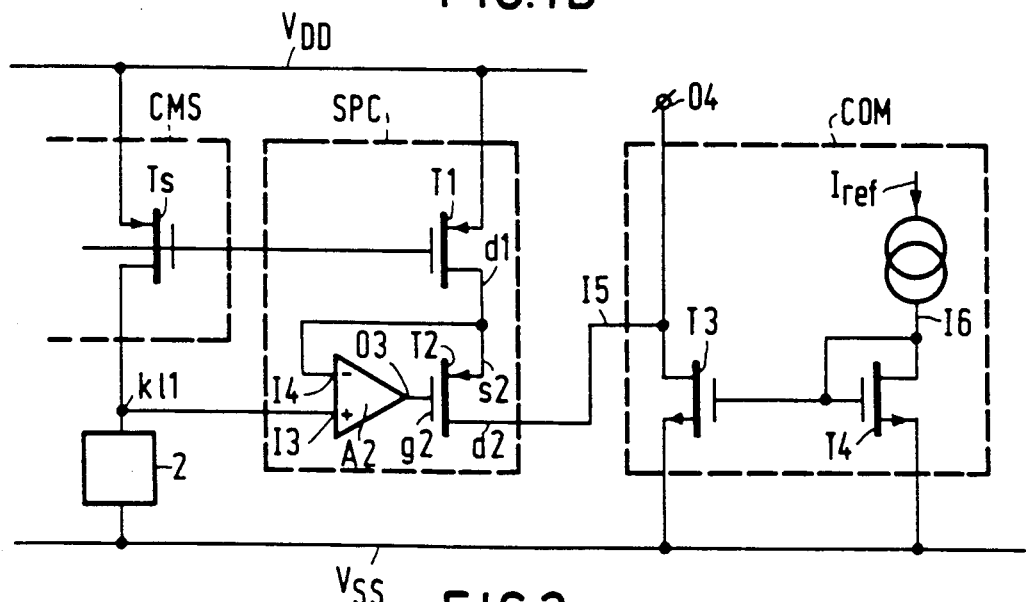

FIG. 2 shows an embodiment of a signal processing means SPC and comparison means COM in an arrangement according to the invention. Symbols corresponding to FIG. 1A are indicated in the same manner. The signal processing means further comprise a differential amplifier A2, which is connected via a first input I3(+) to the first connection terminal kl1, via a second input I4(−) to the output electrode d1 of the first transistor T1, and via an output 03 to a gate electrode g2 of a second transistor T2. The transistor T2 is connected by means of a first output electrode s2 to the output electrode dI of the first transistor T1. A second output electrode d2 serves to supply a current $I_O$ to the comparison means COM. The comparison means COM comprise a current mirror configuration constituted by transistors T3 and T4 and having a first input I5 for receipt of the processed quiescent current $I_O$, a second input I6 for the supply of a reference current $I_{ref}$ and a digital output 04. If the current $I_O$ is smaller than $I_{ref}$, the output 04 assumes a first value ("0") and if $I_O > I_{ref}$, the output 04 assumes a second value ("1").

FIG. 3 shows a circuit which provides a multiplication of a measured quiescent current. The signal processing means SPC comprise n transistors T1, ..., T1n and supply n output currents $I_{O1}$, ..., $I_{On}$. The transistors T1, ..., T1n may have increasing chip surfaces so that currents increasing in value may be obtained for further processing. The currents $I_{O1}$, ..., $I_{On}$ may be supplied to analog or digital comparison means. For $I_{O1}$ an analogous situation is shown; $I_{O1}$ is converted by a resistor R into a voltage U, which is supplied to an analog voltage comparator (not shown), for example, of the kind included in a testing apparatus for testing an integrated monolithic digital circuit.

FIG. 4A shows a current measurement according to the invention for measuring a metastable condition in a digital circuit. A metastable condition, i.e. an undefined output value "0" and "1" may occur, for example, due to timing errors and occurs, for example, in flip-flops. A flip-flop as an integrated monolithic circuit 1 and an arrangement 2 according to the invention are shown. The flip-flop 1 has a data input D, a clock input C and an output Q. The arrangement 2 has a control input S and an output O. In a CMOS flip-flop, a comparatively high current (>1mA) can be measured, which occurs due to a metastable condition. The output signal 0 can be used to delay the operation of circuits to be controlled by the flip-flop until the metastable condition has passed.

In FIG. 4B, $I_{DD}$ is shown and in FIG. 4C $U_Q$, i.e. the voltage at the output Q of the flip-flop in a metastable condition is shown. It can be seen that a comparatively large current $I_{DD}$ occurs during a metastable condition m. The normal starting situations for the flip-flops are indicated by "0" and "1".

In FIG. 5 a current measurement according to the invention is shown for obtaining information about the stability of outputs of combinatorial digital subcircuits. The arrangement 1 has additional inputs and outputs in the form of "handshake" signals H. The integrated monolithic digital circuit 2 has inputs I1, ..., In and outputs 01, ..., On. In the said circuits, it is difficult to detect when a stable condition is attained. By means of an arrangement according to the invention, an indication can be obtained whether an operation is carried out by the circuit 2. The quiescent current arrangement 1 is then integrated with a so-called "handshake" system, which is required to couple such a circuit 2 to similar circuits. The arrangement 1 is set to the "ready for use" condition when a "handshake" signal is received and waits until a peak current has decreased to a quiescent current. The arrangement 1 then supplies a "handshake" signal to a similar circuit to indicate that data can be transferred. Delays are then no longer required between cascaded circuits, as a result of which in principle circuits operating at a higher speed can be obtained.

FIG. 6 shows a testing apparatus TD provided with an arrangement 1 according to the invention. The arrangement 1 may also be constructed as an interface for the testing apparatus TD. An apparatus commercially available for testing VLSI circuits is, for example, a "Sentry 50" tester of Schlumberger. The arrangement according to the invention can be entirely or partly incorporated therein.

Figure 7A:
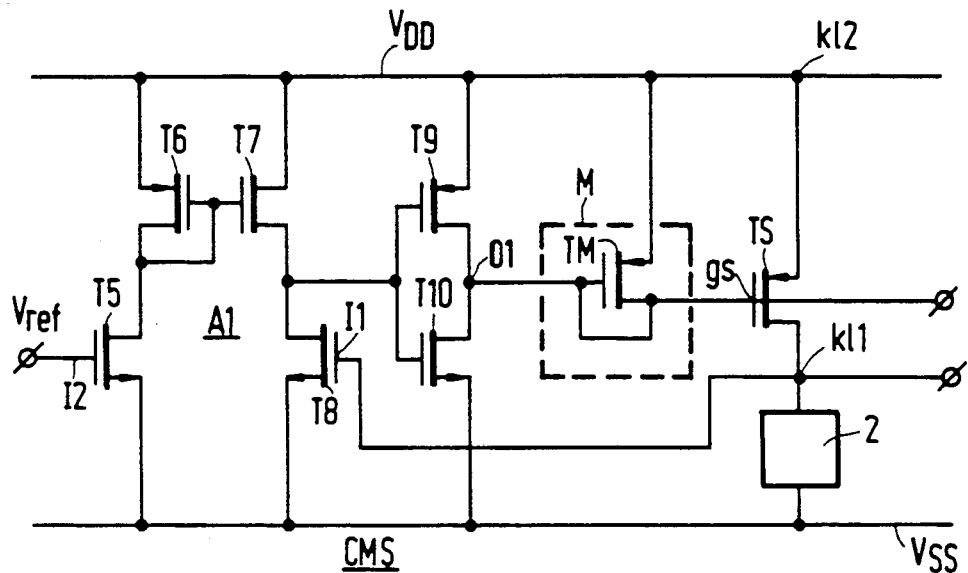

FIG. 7A shows an embodiment of the current measuring circuit CMS with an embodiment of the modification circuit M. The operational amplifier A1 (see FIG. 1A) is constituted by the transistors T5, T6, T7, T8, T9 and T10 and the modification circuit is constituted by the transistor TM. The remaining reference symbols correspond to those in FIG. 1. In the embodiment shown, the stability is also guaranteed outside of the quiescent current measurement when considerably larger currents flow because in the configuration chosen, A1 then has a low amplification.

Figure 1B:
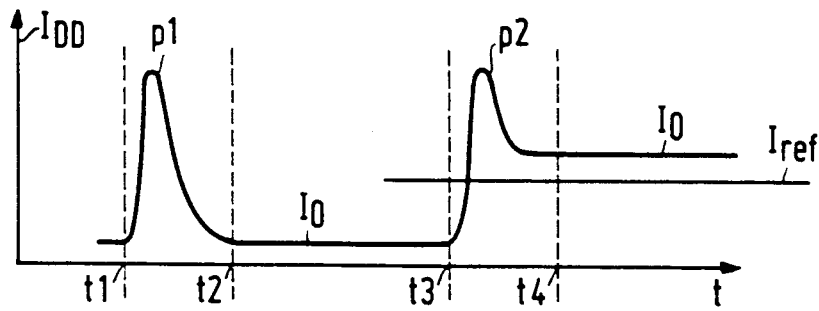
Figure 7B:
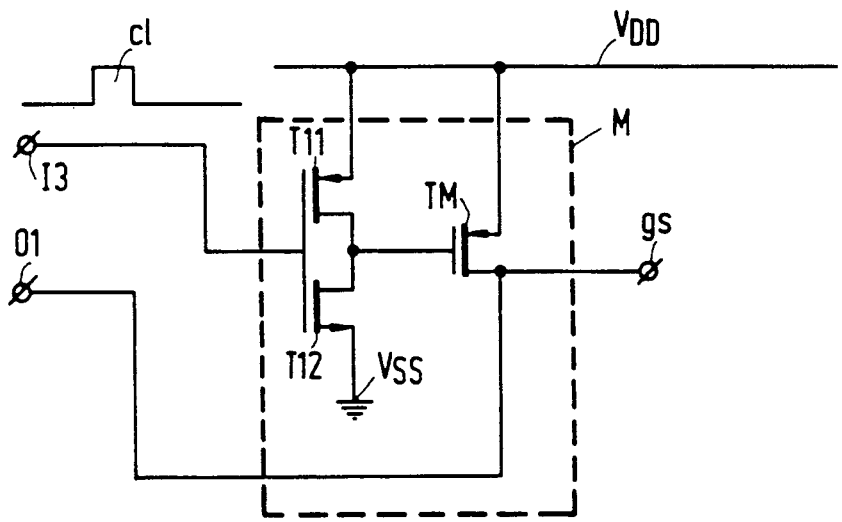

FIG. 7B shows another embodiment of the modification circuit M, which is coupled to the output 01 of the amplifier A1 in FIG. 1 and to the input gs of the current sensor Ts. The modification circuit M comprises an inverter T11, T12 coupled to the transistor TM. A clock signal C1 is supplied to an input $I_3$ of the inverter from, for example, the clock generator of the circuit 2, the "Device Under Test" (DUT). Since the inverter has a fixed delay, the phase of the clock signal should be such that the modification circuit M switches more rapidly than the DUT.

Figure 8A:
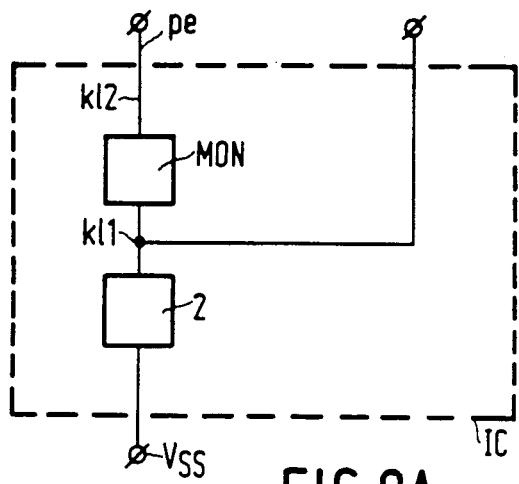
Figure 8B:
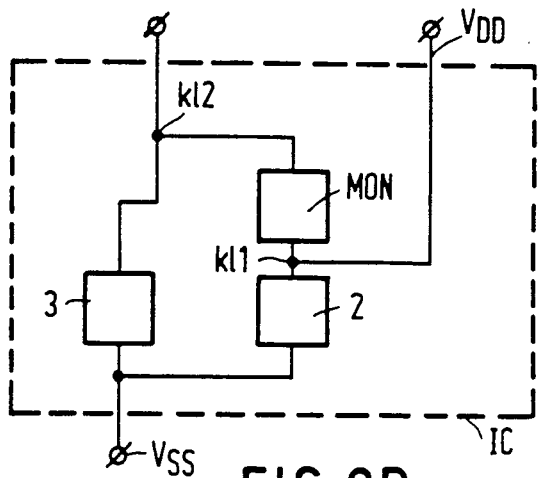

FIGS. 8A and 8B show configurations of integrated circuits (IC's) including a current measuring arrangement according to the invention. The IC has, besides the pins usually present, an additional pin Pe in the configuration shown in FIG. 8A. If the IC includes circuits drawing large currents, which remain outside the $I_{DDQ}$ measurement, because of the fact that the circuits drawing large currents are already supplied via an additional pin, i.e. the additional pin for $I_{DDQ}$ measurement, the terminal kl1 is then floating and $V_{DD}$ is supplied to kl2. FIG. 8B shows such a configuration.

Figure 9:
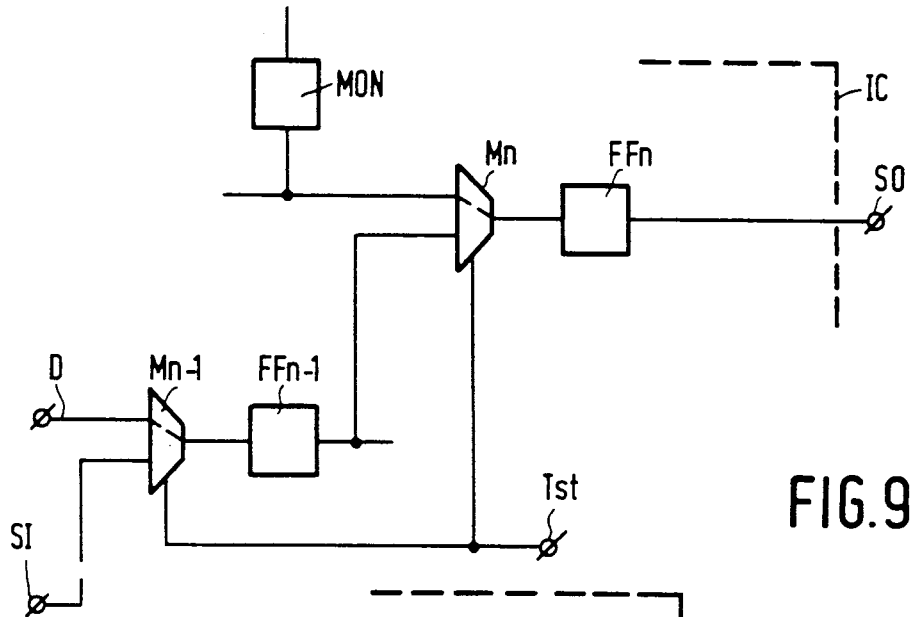

FIG. 9 shows the coupling of the current measuring arrangement according to the invention with a scan chain in an IC. A scan chain, which is well known, is constituted by a number of flip-flops ..., FFn−1, FFn in an IC during testing of the IC. The flip-flops in the IC are joined to form a shift register by means of multiplexers ..., Mn−1, Mn during testing. Data are supplied to a multiplexer at the beginning of a scan chain at an input SI and are clocked in into the shift register thus formed. At the end of the scan chain, test data become available again at an output pin SO of the IC. An $I_{DDQ}$ monitor MON according to the invention can be coupled to the scan chain, for example, via an additional multiplexer, at a predetermined point in the scan chain. The scan chain is switched on by a control signal Tst. Since a pin was already necessary for the scan test, no additional pin is required for the $I_{DDQ}$ measurement. The $I_{DDQ}$ monitor MON can also be multiplexed with the output of the scan chain. In the scan test mode, that is to say when the signal Tst has a first value, the output of the scan chain is passed to an IC pin, while in the normal mode, that is to say when the signal Tst has a second value, the output of the $I_{DDQ}$ monitor is passed to the IC pin. Per IC, several $I_{DDQ}$ monitors can be present, which can all be coupled to the scan chain.

For testing printed circuit boards (PCB's), an integrated circuit can be formed comprising an $I_{DDQ}$ monitor according to the invention and a so-called boundary scan controller, which is well known per se. The $I_{DDQ}$ monitor then measures the current through a supply line, which is connected to a number of IC's to be measured. The result of the current measurement can then be stored in a register in the boundary scan controller.

Figure 10:
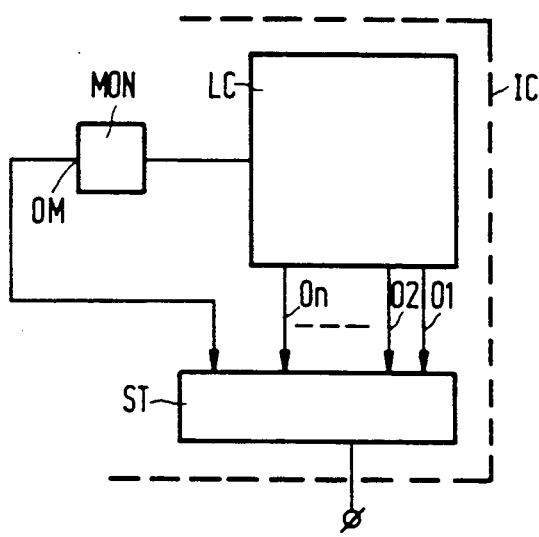

FIG. 10 shows the coupling of the current measuring arrangement MON according to the invention with a self-test circuit ST in an integrated circuit IC. The monitor MON measures the quiescent current $I_{DDQ}$ of the logic circuit LC. The self-test circuit ST is connected not only to outputs 01, 02, ... On of the logic circuit LC, but also to the output OM of the monitor. If a self-test circuit is present in the IC, in this manner an additional pin for the $I_{DDQ}$ monitor is not required. The self-test circuit is, for example, a so-called "linear feedback shift register", which is well known in the field of testing.

It should be noted that the number of applications is not limited to the applications described. For example, when providing (parts of) the arrangement (in multiple) on a printed circuit board, the current measurement may be used for "connectivity checking", i.e. detecting interrupted print tracks or shortcircuits between print tracks. The arrangement according to the invention may also be included in a "boundary scan chain". Besides the MOS technique, the arrangement may also be constructed in another technique, such as, for example, a bipolar technique.

It should further be noted that with integration of the $I_{DDQ}$ monitor in an IC having circuits whose $I_{DDQ}$ is measured, the $I_{DDQ}$ monitor typically occupies about 1% of the "active area". In such a case, the monitor is arranged at an unused area at the periphery of the IC. In general no additional processing steps are required for also integrating the $I_{DDQ}$ monitor.

We claim:

1. An arrangement for measuring a quiescent current of an integrated monolithic digital circuit comprising a transistor current sensor for receiving the IC quiescent current and which includes a first connection terminal for coupling to a supply terminal of the integrated monolithic circuit and with a voltage second connection terminal for coupling to a supply, characterized in that the arrangement comprises voltage stabilization means for stabilizing a voltage at the first connection terminal and signal processing means coupled to the voltage stabilization means for signal processing of the quiescent current.

2. An arrangement as claimed in claim 1, wherein the voltage stabilization means comprise a differential amplifier having a first input coupled to the first connection terminal, a second input coupled to the second connection terminal or to a connection terminal for connection to a reference voltage source, and an output coupled to a control electrode of the transistor current sensor.

3. An arrangement as claimed in claim 2, wherein the output of the differential amplifier is coupled to the transistor control electrode via a modification circuit for modifying the operation of the transistor current sensor outside of a quiescent current measuring period or outside of a quiescent current measurement of the integrated monolithic circuit.

4. An arrangement as claimed in claim 3, wherein the modification circuit controls the transistor current sensor to be fully conductive.

5. An arrangement as claimed in claim 1, wherein the signal processing means comprises a first transistor which, together with the transistor current sensor form a current mirror configuration which supplies, via an output electrode of the first transistor, a current which is a mirror image of the IC quiescent current.

6. An arrangement as claimed in claim 5, wherein the signal processing means comprise a differential amplifier having a first input coupler to the first connection terminal, a second input coupled to the output electrode of the first transistor and an output coupled to a control electrode of a second transistor, said second transistor having a first output electrode coupled to the output electrode of the first transistor, and wherein a second output electrode of said second transistor supplies a further processed quiescent current.

7. An arrangement as claimed in claim 6, wherein the signal processing means comprise further transistors connected so as to constitute with the transistor current sensor a current mirror configuration for obtaining further processed quiescent currents, the transistors of the signal processing means having different geometric dimensions.

8. An arrangement as claimed in claim 1 which further comprises comparison means coupled to the signal processing means for comparing a processed quiescent current with at least one reference current or reference voltage, the comparison means being arranged to indicate when the reference current or reference voltage is exceeded.

9. An arrangement as claimed in claim 8, wherein the comparison means comprise at least one current mirror configuration having a first input for the supply of a processed quiescent current, a second input for the supply of a reference current and a digital output which assumes, in dependence upon the processes quiescent currents with respect to the reference currents, a first and a second value.

10. An arrangement as claimed in claim 8, wherein the comparison means comprise an analog voltage comparison means.

11. An arrangement as claimed in claim 8, wherein an output of the comparison means is coupled to a scan chain.

12. An arrangement as claimed in claim 8, wherein the output of the comparison means is coupled to a self-test circuit.

13. An integrated monolithic digital circuit comprising at least one subcircuit, wherein the integrated monolithic circuit comprises at least one arrangement or at least a part thereof as claimed in claim 1 for measuring the quiescent current of subcircuits, of combinations of subcircuits or of all subcircuits.

14. An integrated monolithic digital circuit comprising an arrangement as claimed in claim 1, and a boundary scan logic circuit for testing integrated circuits on printed circuit boards, in which the quiescent current measuring arrangement and the boundary scan logic circuit are coupled to each other.

15. A testing apparatus for measuring a quiescent current of an integrated monolithic digital circuit characterized in that the testing apparatus comprises at least a part of the arrangement as claimed in claim 1.

16. An arrangement as claimed in claim 1, wherein the voltage stabilization means comprise a differential amplifier having a first input coupled to the first connection terminal and a second input coupled to a reference voltage point, and means coupling an output of the differential amplifier to the transistor control electrode via a modification circuit for modifying the operation of the transistor current sensor outside of a quiescent current measuring period or outside of a quiescent current measurement of the integrated monolithic circuit.

17. An arrangement as claimed in claim 2, wherein the signal processing means comprise a first transistor which, together with the transistor current sensor form a current mirror configuration which supplies, via an output electrode of the first transistor, a current which is a mirror image of the IC quiescent current.

18. Apparatus for testing an integrated monolithic digital circuit comprising:
a transistor current sensor for receiving a quiescent current of aid integrated circuit,
circuit means including first and second connection terminals for coupling the transistor current sensor to a supply terminal of said integrated circuit and to a voltage supply terminal, respectively,
voltage stabilization means coupled in a feedback circuit between said first connection terminal and a control electrode of the transistor current sensor for stabilizing the voltage at the first connection terminal, and
signal processing means coupled to said circuit means for processing said quiescent current so as to provide an indication of the condition of said integrated circuit.

19. A testing apparatus as claimed in claim 18, wherein,
the voltage stabilization means comprise a first differential amplifier having first and second inputs coupled to the first connection terminal and to a point of reference voltage, respectively, and an output coupled to the control electrode of the transistor current sensor, and
said signal processing means comprise first and second transistors connected in series between said second connection terminal and an output of the signal processing means, a second differential amplifier having first and second inputs coupled to the first connection terminal and to an output electrode of the first transistor, respectively, and an output coupled to a control electrode of the second transistor, and
means coupling said current sensor transistor and said first transistor together to form a current mirror circuit.

20. A testing apparatus as claimed in claim 18 wherein;
said circuit means connect said transistor current sensor in series circuit with said integrated monolithic digital circuit between said voltage supply terminal and a further voltage supply terminal for the integrated circuit,
said signal processing means includes a first field effect transistor and said transistor current sensor comprises a second field effect transistor, and
said circuit means couples said first and second field effect transistors together so as to form a current mirror circuit having an output which supplies an output current determined by the current flowing through the transistor current sensor and which output current provides said indication of the condition of said integrated circuit.

21. A current measuring arrangement as claimed in claim 1 wherein said voltage stabilization means comprise a feedback circuit coupled between said first connection terminal and a control terminal for said transistor current sensor.

* * * * *